United States Patent
Le Bel

[11] Patent Number: 6,144,289
[45] Date of Patent: Nov. 7, 2000

[54] ALARM SIGNALING DEVICE HAVING A TOUCH-TO-SILENCE FEATURE

[75] Inventor: Vincent Victor Le Bel, Tara, Canada

[73] Assignee: SPX Corporation, Muskegon, Mich.

[21] Appl. No.: 09/324,564

[22] Filed: Jun. 2, 1999

[51] Int. Cl.[7] .................................................. G08B 1/00
[52] U.S. Cl. ...................... 340/309.3; 340/630; 340/521; 340/326; 248/292.2; 200/52 R
[58] Field of Search ................................. 340/514, 588, 340/628, 309.3, 286.05, 291–297, 301, 326, 328, 815.47, 630, 521, 644, 527; 200/43.09, 502, 506, 600, 52 R; 248/297.2

[56] References Cited

U.S. PATENT DOCUMENTS

| | | | |
|---|---|---|---|
| 4,438,428 | 3/1984 | Ober et al. | 340/521 |
| 4,477,798 | 10/1984 | Saul et al. | 340/527 |
| 4,518,946 | 5/1985 | Solomom | 340/326 |
| 4,567,477 | 1/1986 | Cormier | 340/644 |
| 4,814,748 | 3/1989 | Todd | 340/527 |
| 4,862,141 | 8/1989 | Jordal | 340/521 |
| 5,149,038 | 9/1992 | VanCleve | 248/297.2 |
| 5,403,980 | 4/1995 | Eckrich | 200/52 R |
| 5,422,629 | 6/1995 | Minnis | 340/630 |
| 5,442,336 | 8/1995 | Murphy et al. | 340/628 |
| 5,815,066 | 9/1998 | Pumilia | 340/309.15 |

*Primary Examiner*—Daniel J. Wu
*Assistant Examiner*—Phung Nguyen
*Attorney, Agent, or Firm*—Hovey, Williams, Timmons & Collins

[57] ABSTRACT

An alarm signaling device (10) that is operable to produce an alarm signal in a room when triggered by a fire alarm control panel. The signaling device includes a silencing circuit (24) that can be activated by a person in the room to temporarily extinguish the alarm signal. The silencing circuit includes a timing circuit (30) and a switch (32) consisting of a pair of touch contacts (38, 40) that are activated by body resistance.

6 Claims, 2 Drawing Sheets

ALARM SIGNALING DEVICE HAVING A TOUCH-TO-SILENCE FEATURE

BACKGROUND OF THE INVENTION

1. FIELD OF THE INVENTION

The present invention relates to alarm signaling devices configured for mounting in rooms or other small areas monitored by a fire alarm control panel. More particularly, the invention relates to an alarm signaling device that is operable to produce an alarm signal when triggered by a fire alarm control panel and that includes a silencing circuit that can be activated by a person in the room for temporarily extinguishing the alarm signal.

2. DESCRIPTION OF THE PRIOR ART

Fire alarm systems typically include a plurality of small alarm signaling devices that are installed in rooms or other small areas of a building or other structure and a fire alarm control panel coupled with all of the alarm signaling devices for controlling the operation thereof. When the fire alarm control panel or any sensors coupled therewith sense a fire or other dangerous condition within the building, the control panel triggers all of the alarm signaling devices.

It is often desirable to silence a particular alarm signaling device without turning off or resetting the entire fire alarm system. For example, during testing of a fire alarm system, persons in a particular room not participating in the test may wish to temporarily silence the alarm signaling device located in that room. However, known prior art signaling devices can only be silenced at the fire alarm control panel by an authorized person who has access to the panel.

OBJECTS AND SUMMARY OF THE INVENTION

The present invention solves the above-described problems and provides a distinct advance in the art of alarm signaling devices. More particularly, the present invention provides an alarm signaling device that is operable to produce an alarm signal in a room when triggered by a fire alarm control panel and that includes a silencing circuit that can be activated by a person in the room to temporarily extinguish the alarm signal.

The silencing circuit preferably includes a timing circuit for extinguishing the alarm signal for a predetermined time period when triggered and for re-enabling the alarm signal after the expiration of the time period and a switch that can be activated by a person in the room for triggering the timing circuit. The switch preferably includes a pair of spaced-apart touch contacts that are activated by body-resistance. Specifically, the contacts trigger the timing circuit when a person in the room simultaneously touches both the contacts with one or more of his or her fingers.

BRIEF DESCRIPTION OF THE DRAWING FIGURES

A preferred embodiment of the present invention is described in detail below with reference to the attached drawing figures, wherein.

DETAILED DESCRIPTION OF THE PREFERRED EMBODIMENTS

Figure 1:
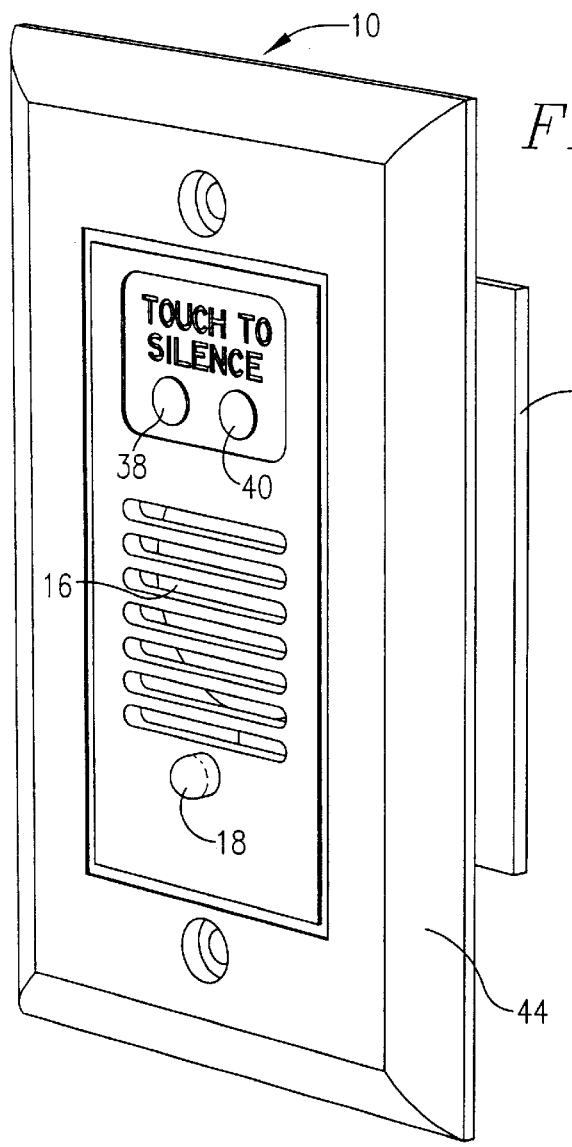
FIG. 1 is a perspective view of an alarm signaling device constructed in accordance with a preferred embodiment of the present invention.

Turning now to FIG. 1, an alarm signaling device 10 constructed in accordance with a preferred embodiment of the invention is illustrated. The signaling device is configured for mounting to a wall of a room or other small area monitored by a conventional fire alarm control panel (not shown) and is operable for emitting an alarm signal in the room when triggered by the control panel.

Figure 4:
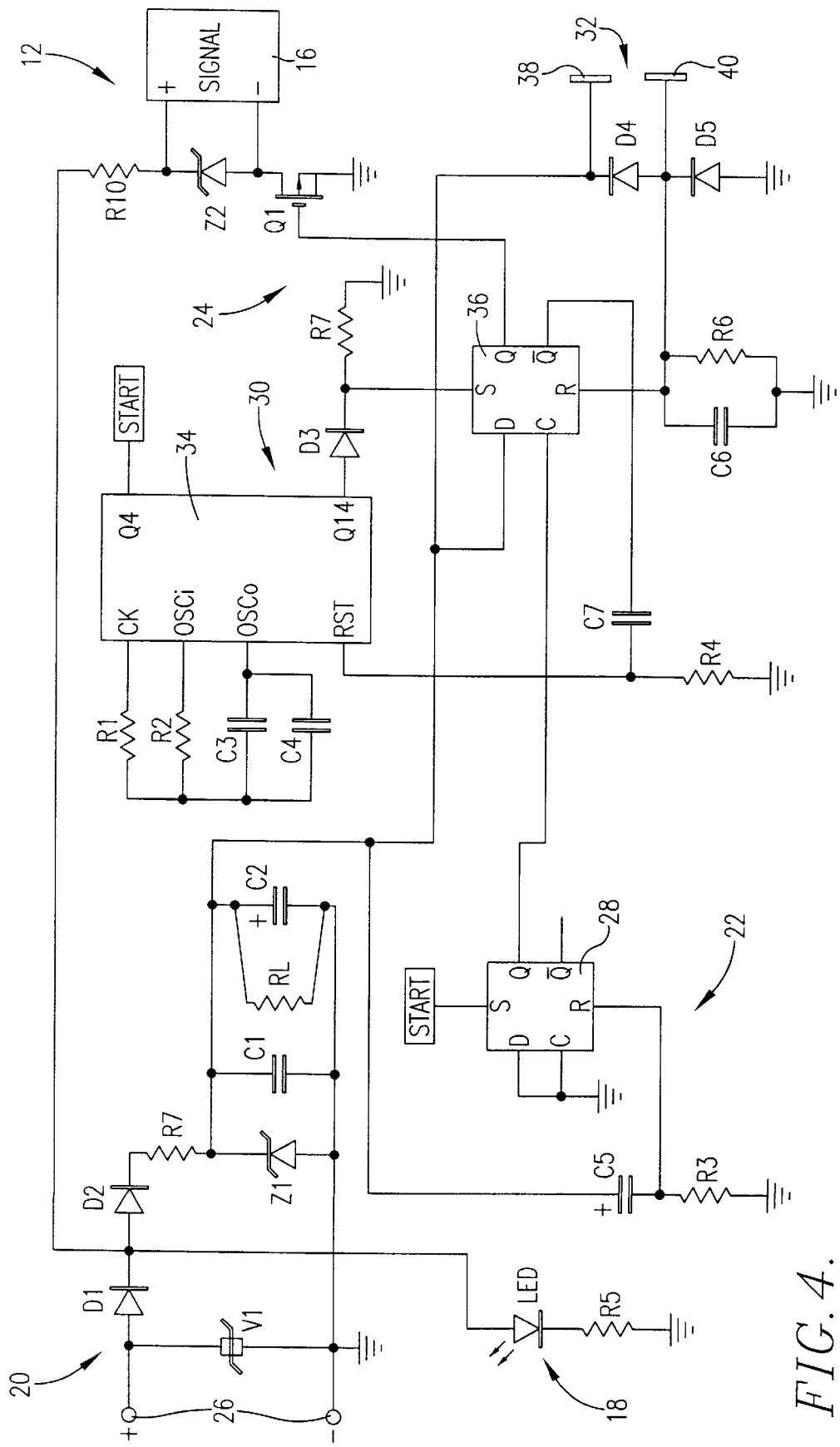
FIG. 4 is a circuit diagram of the electronic circuitry of the alarm signaling device.

As illustrated in FIG. 4, the signaling device includes one or more alarm devices 12 and electronic circuitry broadly referred to by the numeral 14 for powering and controlling the operation of the alarm devices. The alarm devices preferably include a piezo buzzer 16, horn, speaker or other conventional sound-emitting device and a light-emitting diode (LED) 18 or other conventional visual indicator.

The electronic circuitry 14 broadly includes power supply circuitry 20, power-up/reset circuitry 22, and silencing circuitry 24. The power supply circuitry includes a pair of contacts or terminals 26 for coupling with wiring connected to a conventional fire alarm control panel. The contacts or terminals receive both power (20–24 VDC) and control signals from the control panel. Power delivery to the signaling device is regulated by a pair of zenerdiodes Z1 (12 v, 1 W) and Z2 (18 v, 1 W), a pair of diodes D1 (1N4006), D2 (1N4006), a pair of capacitors C1 (1 uF, 50 v), C2 (100 uF, 25 v) and a resistor R7 (3 K ohm). Z1 regulates the power delivered to the electronic circuitry and Z2 regulates the power to the buzzer 16 and LED 18 so that the electronic circuitry can be powered by a separate branch than the buzzer and LED to permit the electronic circuitry to function for short periods of time during momentary power disruptions. A varistor V1 (47 v) suppresses transients in signals delivered by the fire alarm control panel created by electromagnetic devices that reside on the same circuit.

The power-up/reset circuitry 22 includes a latch 28 (MQ4013 or CD4013B), a resistor R3 (82 K ohm) and a capacitor C5 (4.7 uF, 35 v). Upon power-up of the signaling device 10, C5 and R3 provide basis for a reset signal on the latch. This guarantees that the output Q of the latch will power up in a known low level state so that the buzzer 16 will always energize on power-up of the signaling device.

The silencing circuitry 24 broadly includes timing circuitry referred to by the numeral 30 and a switch 32 for triggering the timing circuitry. The timing circuitry is configured for silencing the buzzer 16 when triggered and for permitting the buzzer to operate normally at predetermined time interval after the timing circuit has been triggered. The timing circuitry includes an oscillator/counter integrated circuit 34, a latch 36 and a transistor Q1 (FET 2N7000).

The latch 36 is coupled with the oscillator/counter 34, the transistor Q1, and the switch 32 and is configured for temporarily silencing the buzzer when the switch is activated and for permitting the buzzer to operate normally once the oscillator/counter has reached its maximum count value. The transistor Q1 switches the buzzer on and off when triggered by the latch.

The oscillator/counter 34 is coupled with the switch 32 and the latch 36 and is operable for counting a predetermined time interval after it has been triggered by the switch. At the expiration of this time, the oscillator/counter triggers the latch to re-enable the buzzer. To comply with fire codes, the silencing circuitry must re-trigger the buzzer within 10 minutes after it has been temporarily silenced. In the preferred embodiment, the silencing circuit is configured to re-trigger the buzzer within approximately 7.5 minutes.

Therefore, the oscillator frequency of the oscillator/counter is selected to be 18 Hz+/−3 Hz so that the counter reaches its maximum count value between 6.5 minutes and 9.1 minutes, which is centered around 7.5 minutes.

The timing circuitry 30 of the present invention is superior to prior art timing capacitors and discrete semiconductors. To meet fire system standards, the timing circuitry must achieve relatively tight timing of +/−1.5 minutes and be capable of accurate timing over a temperature range of 0° C. to 49° C. The oscillator/counter integrated circuit 34 and other components of the timing circuitry of the present invention easily meet these standards and are more reliable and stable than prior art timing circuitry.

The switch 32 is coupled with the timing circuitry 30 for triggering the oscillator/counter 34 and latch 36 when activated by a person in the room in which the signaling device is located. The switch preferably comprises a pair of spaced-apart touch contacts 38, 40 that trigger the oscillator/counter 34 and latch 36 when a person in the room places his or her finger thereacross. Specifically, the body resistance between a person's two fingers, which is in the order of three meg ohms, causes the switch to change state to trigger the oscillator/counter and latch. A pair of diodes D4 and D5 (both 1N4006) are connected between the touch contacts to minimize damage to the signaling device caused by electrostatic discharges when a person touches the touch contacts. A capacitor C6 (1 uf) and a resistor R6 (10 M ohm) are connected between the diodes D4 and D5 to minimize RF noise that may be introduced when a person touches the touch contacts and to prevent the latch reset input from floating.

Figure 2:
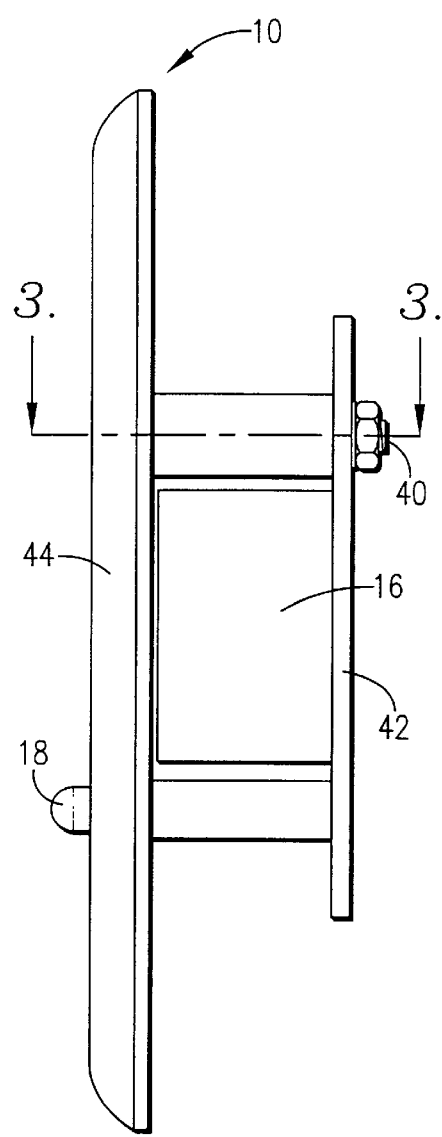
FIG. 2 is a side elevational view of the signaling device.
Figure 3:
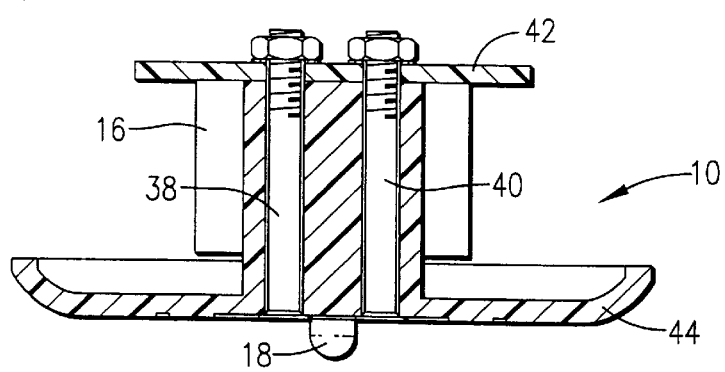
FIG. 3 is a horizontal sectional view of the signaling device taken along line 3—3 of FIG. 2.

As illustrated in FIGS. 1–3, the buzzer 16, LED 18, and electronic circuitry 14 are preferably mounted on a small printed circuit board 42 that is attached to the rear of a face plate 44. The printed circuit board and face plate together measure approximately 4.5 inches in height, 2.5 inches in width, and 1.375 inches in depth so that the signaling device 10 fits within a conventional single electrical gang box. As best illustrated in FIG. 3, the touch contacts are preferably elongated, rod-shaped, nickel-plated pems or posts that protrude slightly through the front of the face plate. The face plate includes slots or holes for permitting sound from the buzzer to emit therethrough and an opening for allowing the LED to extend therethrough.

The use of touch contacts 38, 40 to form the switch rather than conventional mechanical switches reduces the cost and complexity of the signaling device. Moreover, the touch contacts serve not only as a switch but also establish the electrical connection and mechanical mounting of the printed circuit board 42 to the face plate 44. Specifically, one end of each of the touch contacts is screwed and bolted through the printed circuit board and the other end of each of the contacts extends through the face plate.

In operation, the buzzer 16 sounds and the LED 18 is lit whenever the terminals 26 of the power supply circuitry 20 receive an alarm signal from a fire alarm control panel. If a person in the room in which the signaling device is located wishes to silence the buzzer, he or she may touch the touch contacts 28, 40 that extend through the face plate 44 of the signaling device. The body resistance between the person's fingers completes a circuit between the touch contacts to enable the reset line R of the latch 36. This turns off the Q output of the latch to temporarily disable the buzzer. This also creates a positive going pulse on the $\overline{Q}$ output of the latch which resets the oscillator/counter 34 so that the oscillator/counter begins a counting sequence. When the oscillator/counter reaches its maximum count value, which is preferably selected to be approximately 7.5 minutes, its terminal Q14 generates an output signal to set the latch 36. This creates a positive going pulse at the Q output of the latch to re-trigger the buzzer so that the buzzer once again sounds. Once the buzzer resounds, a person in the room may once again touch the touch contacts to reinitiate the silencing function. The LED 18 remains lit during an entire alarm condition to provide a silent indication of the alarm.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by letters patent includes the following:

1. An alarm signaling device configured for placement in a room monitored by a fire alarm control panel to provide alarm signaling in the room, the signaling device comprising:
   an alarm operable to provide an alarm signal in the room when triggered by the fire alarm control panel; and
   a silencing circuit coupled with the alarm and activatable by a person in the room for temporarily extinguishing the alarm signal, the silencing circuit including
      a timing circuit for extinguishing the alarm signal when triggered and for permitting the alarm to operate normally a predetermined time interval after being triggered, and
      a switch activatable by a person for triggering the timing circuit, the switch including a pair of spaced-apart conductive posts that serve both as touch contacts for triggering the timing circuit when a person simultaneously touches the posts and as a mechanical mount for mounting the silencing circuit to a face plate.

2. The alarm signaling device as set forth in claim 1, the timing circuit including
   an oscillator coupled with the switch for counting a pre-determined time interval after the switch has been activated; and
   a latch coupled between the alarm and the switch for extinguishing the alarm when the switch is activated and coupled with the oscillator for permitting the alarm to operate normally when the oscillator has counted the pre-determined time interval.

3. An alarm signaling device configured for placement in a room monitored by a fire alarm control panel to provide alarm signaling in the room, the signaling device comprising:
   a circuit board;
   an alarm mounted to the circuit board and operable to provide an alarm signal in the room when triggered by the fire alarm control panel;
   a silencing circuit mounted to the circuit board and coupled with the alarm and activatable by a person in the room for temporarily extinguishing the alarm signal;
   a face plate for covering the circuit board; and
   the silencing circuit including a pair of spaced-apart touch contacts operable to extinguish the alarm signal when a person simultaneously touches both of the contacts and to mount the face plate to the circuit board.

4. An alarm signaling device configured for placement in a room monitored by a separate fire alarm control panel to provide alarm signaling in the room, the signaling device comprising:

an alarm operable to provide an alarm signal in the room when triggered by the fire alarm control panel; and electronic circuitry for powering and controlling operation of the alarm, the electronic circuitry including an input for receiving an alarm triggering signal from the fire alarm control panel for triggering the alarm, and a silencing circuit coupled with the alarm and activatable by a person in the room for temporarily extinguishing the alarm signal.

5. The alarm signaling device as set forth in claim 4, the silencing circuit including timing circuit for extinguishing the alarm signal when triggered and for permitting the alarm to operate normally a predetermined time interval after being triggered; and a switch activatable by a person for triggering the timing circuit.

6. The alarm signaling device as set forth in claim 5, wherein the switch is a pair of spaced-apart touch contacts operable to trigger the timing circuit when a person simultaneously touches both the contacts.

\* \* \* \* \*